United States Patent [19]

Tong

[11] Patent Number: 5,336,625

[45] Date of Patent: Aug. 9, 1994

[54] BICMOS PROCESS WITH LOW BASE RECOMBINATION CURRENT BIPOLAR TRANSISTORS

[75] Inventor: Paul C. F. Tong, San Jose, Calif.

[73] Assignee: Samsung Semiconductor Corporation, San Jose, Calif.

[21] Appl. No.: 130,249

[22] Filed: Oct. 1, 1993

Related U.S. Application Data

[60] Division of Ser. No. 873,484, Apr. 22, 1992, Pat. No. 5,304,501, which is a continuation of Ser. No. 613,191, Nov. 14, 1990, abandoned.

[51] Int. Cl.$^5$ ............... H01L 21/265; H01L 29/70
[52] U.S. Cl. .................... 437/31; 437/59; 257/370; 257/565; 148/DIG. 10
[58] Field of Search ............. 437/31, 59; 148/DIG. 9, 148/10, 11; 257/370, 565

[56] References Cited

U.S. PATENT DOCUMENTS

| | | |
|---|---|---|
| 4,902,640 | 2/1990 | Schitano et al. |
| 4,927,776 | 5/1990 | Soejima .................................. 437/59 |
| 4,965,220 | 10/1990 | Iwasaki . |
| 4,987,089 | 1/1991 | Roberts . |
| 5,013,677 | 5/1991 | Hozumi .................................. 437/31 |
| 5,091,322 | 2/1992 | Maeda et al. .......................... 437/31 |
| 5,100,815 | 3/1992 | Tsubone et al. . |
| 5,104,817 | 4/1992 | Scott ..................................... 437/59 |
| 5,179,031 | 1/1993 | Brassington et al. .................. 437/31 |

FOREIGN PATENT DOCUMENTS 0226892 12/1986 European Pat. Off. .

OTHER PUBLICATIONS

C. T. Chuang, et al, "Effect Of Off-axis Implant On the Characteristics of Advanced Self-aligned Bipolar Transistors," *IEEE Electron Device Letters*, vol. 8, #7, Jul. 1987, pp. 321–323.

M. H. El-Diwany, et al., "Increased Current Gain and Suppression of Peripheral Base Currents in Silicide Self-aligned Narrow-width Polysilicon Emitter Transistors of an Advanced BICON Technology," *IEEE Electron Device Letter*, vol. 9, #5, May 1988, pp. 247–249.

T. Ikeda, et al., "Advanced BIMOS Technology for High Speed VLSI," *IEDM*, 1986, pp. 408–411.

E. H. Nicollian, et al, Published by *John Wiley & Son*, "MOS (Metal Oxide Semiconductor) Physics and Technology," 1982 pp. 756–759.

T. Sugii, et al., "Epitaxially Grown Base Transistor for High-speed Operation," *IEEE Electron Device Letters*, vol. 8, #11, Nov. 1987, pp. 528–530.

P. Tong, et al., "A Production Proven High Performance 1.0 $\mu$m Double-level Polysilicon BIMOS Technology," *Semiconductor Technical Journal*, vol. 5, #1, Jun. 1990, pp. 106–112.

Patent Abstracts of Japan, vol. 12, No. 393 (E670), (3240), Oct. 19, 1988, JP-A-63 133662 (NEC) Jun. 6, 1988.

*Primary Examiner*—Olik Chaudhuri
*Assistant Examiner*—Long Pham
*Attorney, Agent, or Firm*—Skjerven, Morrill, MacPherson, Franklin & Friel

[57] ABSTRACT

A process for manufacturing an integrated circuit having both field effect and bipolar transistors provides, in one embodiment, a polycide film over the gate and field oxides. The polycide film is patterned such that a protective structure of gate material is formed on top the base region while the gate of the FET is formed, in a single process step. Ionic species are implanted to form the source and drain and the collector contact. The protective structure of gate material in the active region of the bipolar transistor is removed just before the base region is implanted to form the base. In a second embodiment, a silicon nitride oxidation mask for field oxide regions is formed over the bipolar transistor and the field effect transistor active regions. The portion of the nitride oxidation mask is removed only from the FET active regions after field oxide regions are formed. The portion of the nitride oxidation mask is left intact through formation of the gate regions of the FETs, formation of the oxide spacers of the FET active regions, and the formation of source and drain regions of the NMOS transistor. The nitride oxidation mask over the bipolar active region is removed prior to the base implant step. With the nitride oxidation mask over the bipolar transistor active region, a $V_T$ implant into the FET active region is performed.

16 Claims, 12 Drawing Sheets

BICMOS PROCESS WITH LOW BASE RECOMBINATION CURRENT BIPOLAR TRANSISTORS

CROSS-REFERENCE TO RELATED APPLICATIONS

This application is a divisional application of U.S. patent application Ser. No. 07/873,484, filed Apr. 22, 1992, entitled "BiCMOS Process With Low Base Recombination Current Bipolar Transistor", U.S. Pat. No. 5,304,501 which in turn is a continuation of U.S. patent application Ser. No. 07/613,191, filed Nov. 14, 1990, which has been abandoned.

BACKGROUND OF THE INVENTION

Field of the Invention

This invention pertains to the field of semiconductor integrated circuit (IC) fabrication, and in particular, to the field of semiconductor IC fabrication involving bipolar-complementary metal-oxide-semiconductor (BiCMOS) circuits.

Description of Related Art

As is well known in the art, CMOS transistors, including both PMOS (p-channel metal-oxide-semiconductor) and NMOS (n-channel metal-oxide-semiconductor) transistors, and bipolar transistors are fabricated on the same substrate in a BiCMOS process. Discussions of the BiCMOS technology and device characteristics may be found in (i) an article entitled "Advanced BiCMOS Technology for High Speed VLSI" by T. Ikeda et al., IEDM technical digest, International Electron Devices Meeting, Los Angeles, Dec. 7–10, 1986, pp, 408–411, and (ii) an article entitled "A Production Proven High Performance 1.0 $\mu$m Double-level Polysilicon BiCMOS Technology" by P. Tong et al., Semiconductor Technical Journal, vol. 5, No. 1, 1990, pp 106–112.

A process for fabricating BiCMOS integrated circuits is shown in FIG. 1.

Figure 1A:
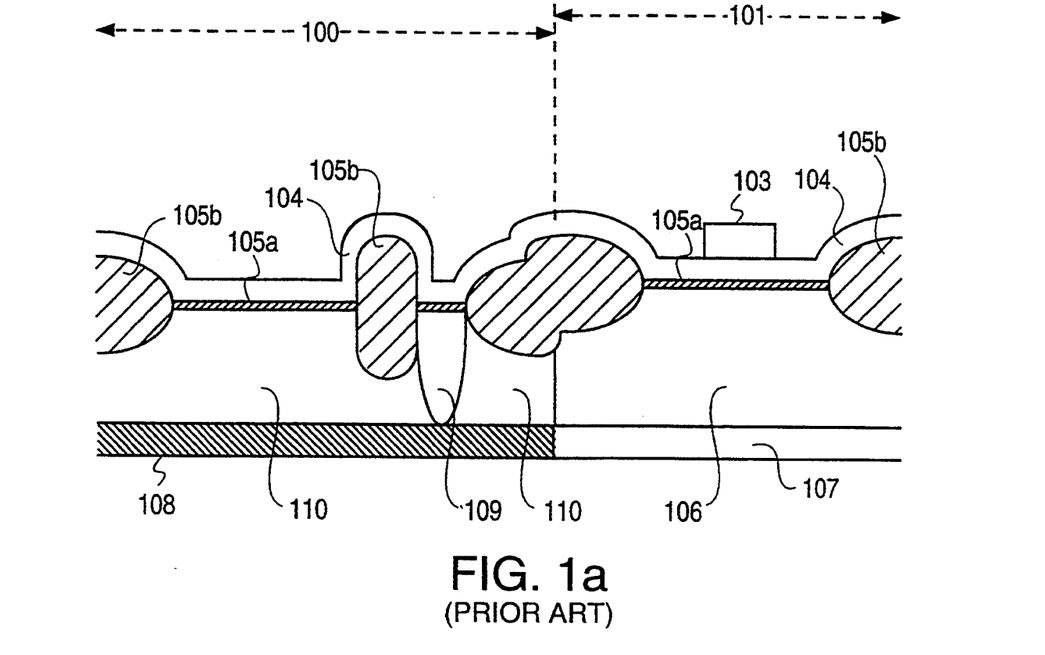
FIGS. 1a–h show various steps of a process in the prior art.

FIG. 1a shows a semiconductor structure being fabricated in a BiCMOS process, at the step after a pattern of the photoresist layer 103 is developed in preparation for etching the immediately underlying polycide layer 104. The polycide layer 104 can be, for example, a tungsten silicide/polysilicon stack. The structure carved out of the polycide layer 104 by the etching step forms the gate of an NMOS transistor. As shown in FIG. 1a, the regions 100 and 101 are, respectively, regions in which a bipolar transistor and a NMOS transistor are to be fabricated. Region 100 includes an n-type buried layer 108 underneath an N-well 110, which included a collector plug region 109. Region 101 includes a p-type buried layer 107 beneath a P-well 106.

On the wafer surface, on top of both P-well 106 and N-well 110, is shown an oxide layer, which includes gate oxide 105a and field oxide 105b regions. A polycide layer 104 is formed on top of the oxide layers 105a and 105b. In the process shown, the polycide layer 104 comprises tungsten silicide on top of a phosphorus-doped polysilicon.

Figure 1B:
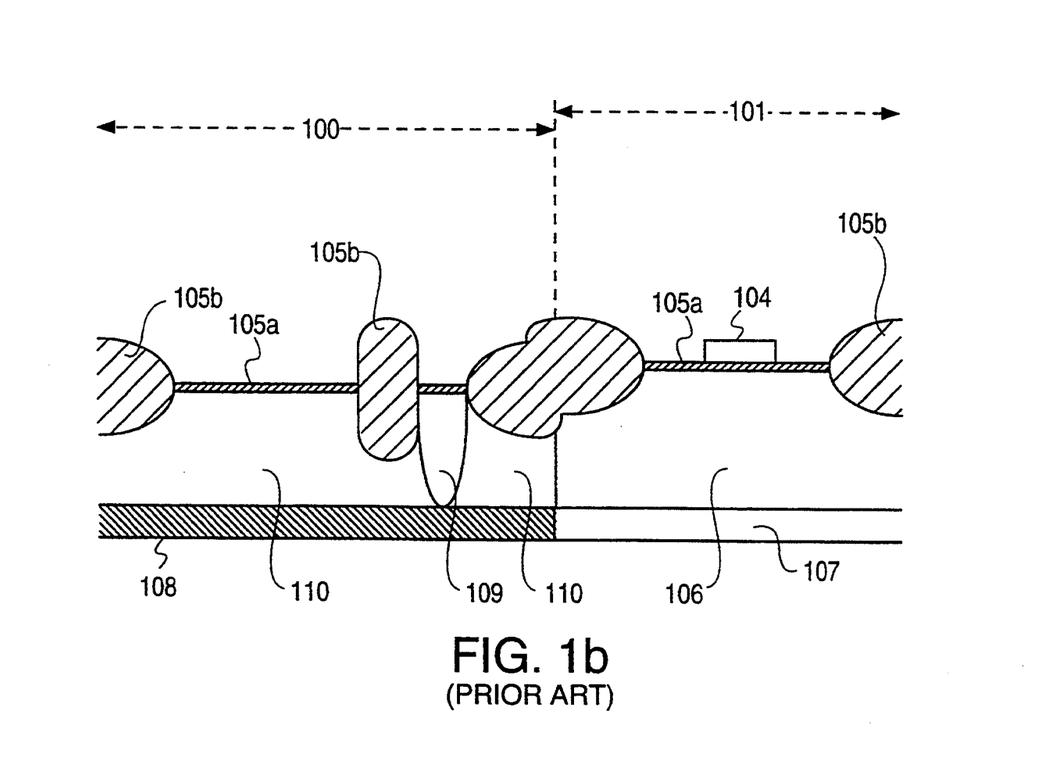
Figure 1C:
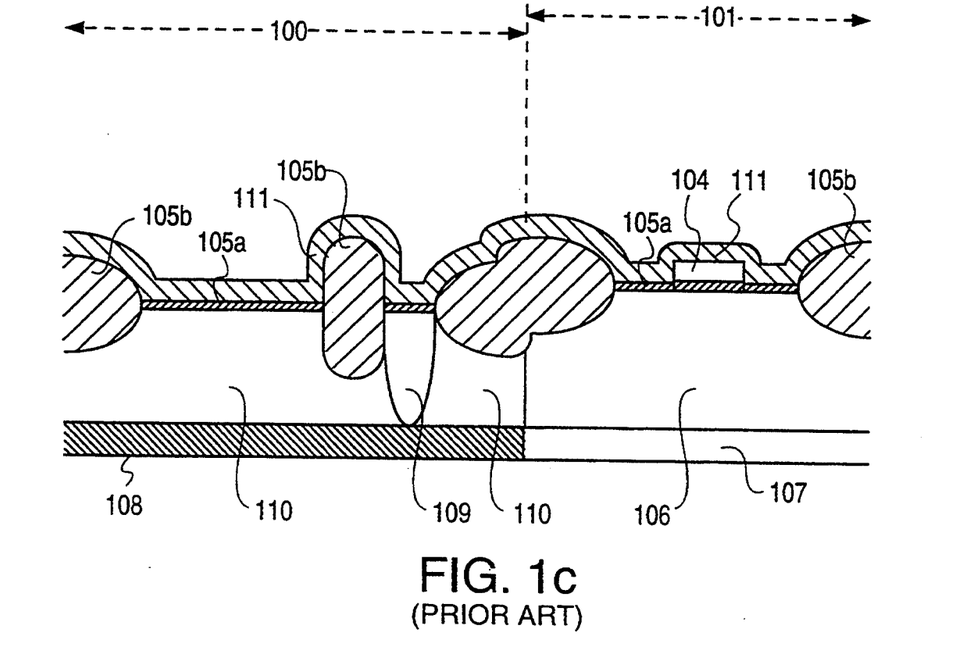
Figure 1D:
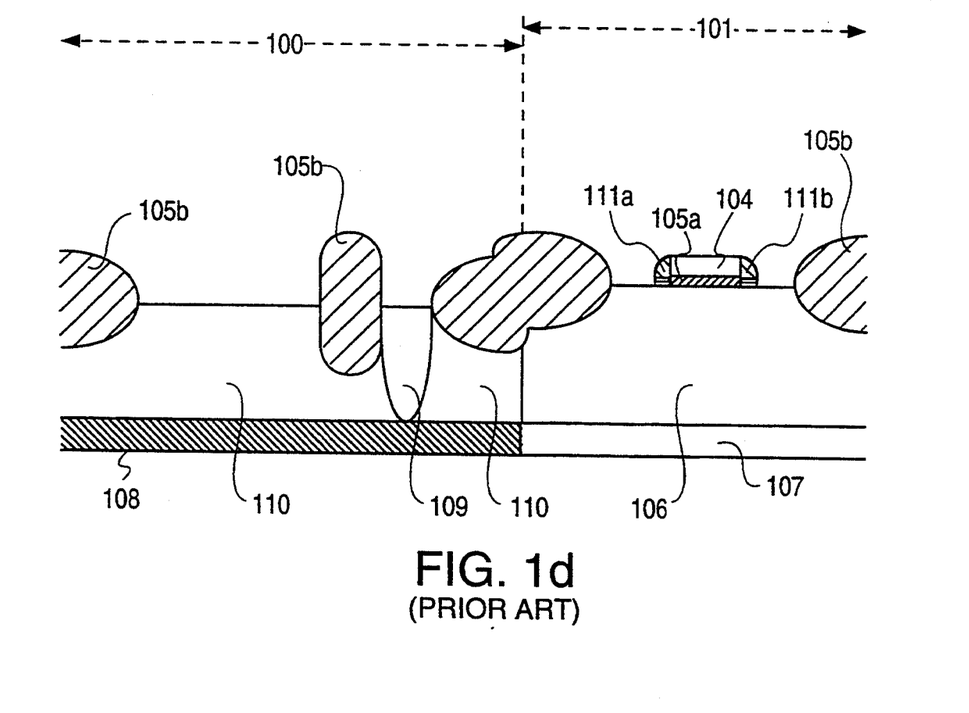

FIG. 1b shows the semiconductor structure after a selective etch of polycide layer 104 to form the gate of the NMOS transistor, and removal of photoresist layer 103. An annealing step for the polycide gate 104 is then performed, which is followed by the deposition of a layer 111 of low temperature oxide (FIG. 1c). This low temperature oxide layer 111 is then anisotropically etched to leave portions 111a and 111b (FIG. 1d), called oxide spacers, on the sidewalls of the polycide gate 104. Generally, the oxide layer 111 is overetched in forming spacers 111a and 111b, in order to achieve across the wafer uniform junction depth and sheet resistivity at the MOS transistors' source and drain regions. Uniformity in these regions is important because the implant range of the dopant species, such as arsenic or boron difluoride, is sensitive to the oxide thickness left on top of the active regions after the spacer etch. A uniform junction depth and sheet resistivity is necessary to manufacture devices which actual electrical characteristics are closer to the predicted values used in their design.

Figure 1E:
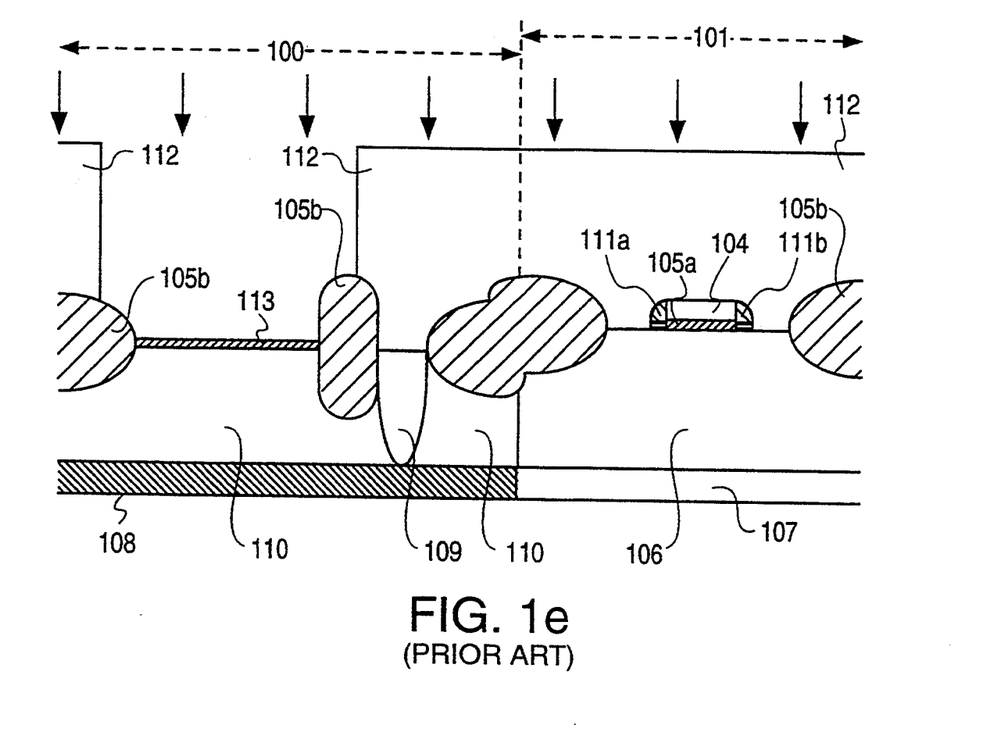

Photoresist layer 112 is then applied and patterned for implanting p-type ionic species in the bipolar region 100 to form the base 113 of a bipolar transistor (FIG. 1e). During this step, an ionic species such as boron is implanted into the bare silicon surface exposed after the spacer etch. This implant step may cause "channeling", if no special precaution is taken. Channeling occurs when atoms of an implanted species are introduced into the crystal lattice at such an angle that they are met with little resistance in the interatomic space until they reach a great depth. This effect causes a small but significant impurity concentration deep into the implanted surface called the "channeling tail." The channeling tail is a major obstacle to achieving small base width desirable in advanced bipolar devices.

One method to alleviate the channeling effect is to implant the ionic species at an angle to the lattice structure, such as 7 degrees from the normal of the surface of implant. Such off-axis implants, however, cause other device performance problems because of the non-uniform concentration over the surface due to "shadows" cast by other structures on the semiconductor surface, affecting adversely device characteristics to cause such effects as perimeter-punch through and tunnelling leakage currents. Examples of effects can be found in "Effect of off-axis Implant on the characteristics of Advanced Self-aligned Bipolar Transistors," by C. T. Chuang et al., IEEE Electron Device Letters, Vol. EDL-8, No. 7, July, 1987, pp. 321-23.

Figure 1F:
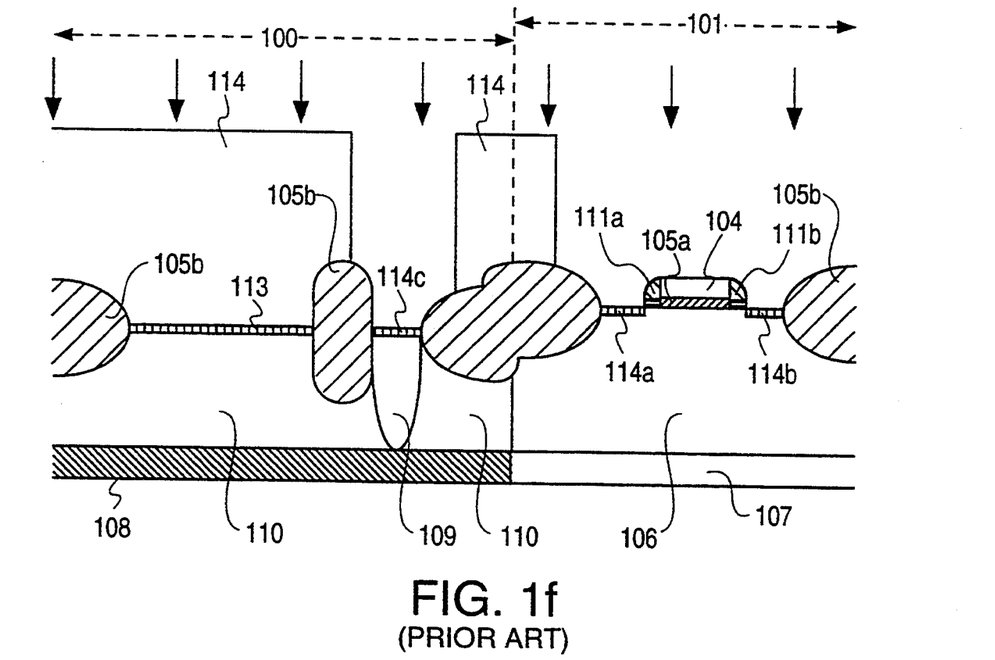
Figure 1G:
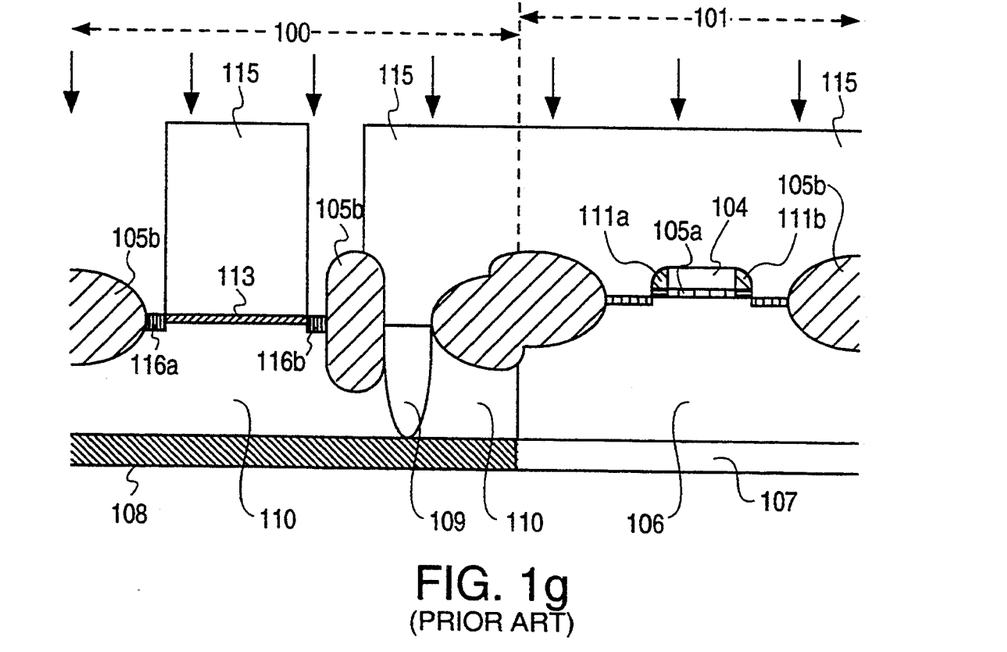

After the base implant step, and having stripped off photoresist 112, a new photoresist layer 114 is deposited and patterned to open the collector contact 114c inside the collector plug region 109 of the bipolar transistor in bipolar region 100. The source 114a and drain 114b regions of the NMOS transistor in region 101 are also exposed at this step. The exposed regions are then implanted with n-type ionic species (FIG. 1f). After an oxygen plasma cleaning step (commonly known as ashing) is applied to remove photoresist 114, the base contact areas 116a and 116b of the bipolar transistor, and the source and drain regions of the PMOS transistor (not shown) are formed by suitably patterning on the photoresist layer 115 and implanting with p-type ionic species (FIG. 1g).

After stripping off photoresist layer 115, a blanket layer of low temperature oxide 117b is deposited over the entire surface, including the electronic-states rich bare silicon base region 113. This low temperature oxide layer is then patterned and selectively etched to form a contact region for use with a second film of polysilicon (see below), e.g. the emitter contact 117a shown.

A second polysilicon film ("POLY II") is then deposited. Thereafter, a layer of photoresist is deposited over this POLY II layer, and is suitably patterned in accordance with a POLY II mask and etched to define second polysilicon features, including the emitter of the Bipolar transistor 117 in bipolar region 100. The remaining portions of the POLY II layer are overlaid by a layer of photoresist which is suitably patterned and developed in accordance with a POLY II implant mask to expose conductive sections for ion implant. Such regions for ion implant include prospective emitter regions in the remaining portions of the POLY II layer. A POLY II implant is then made using an n-type dopant.

Figure 1H:
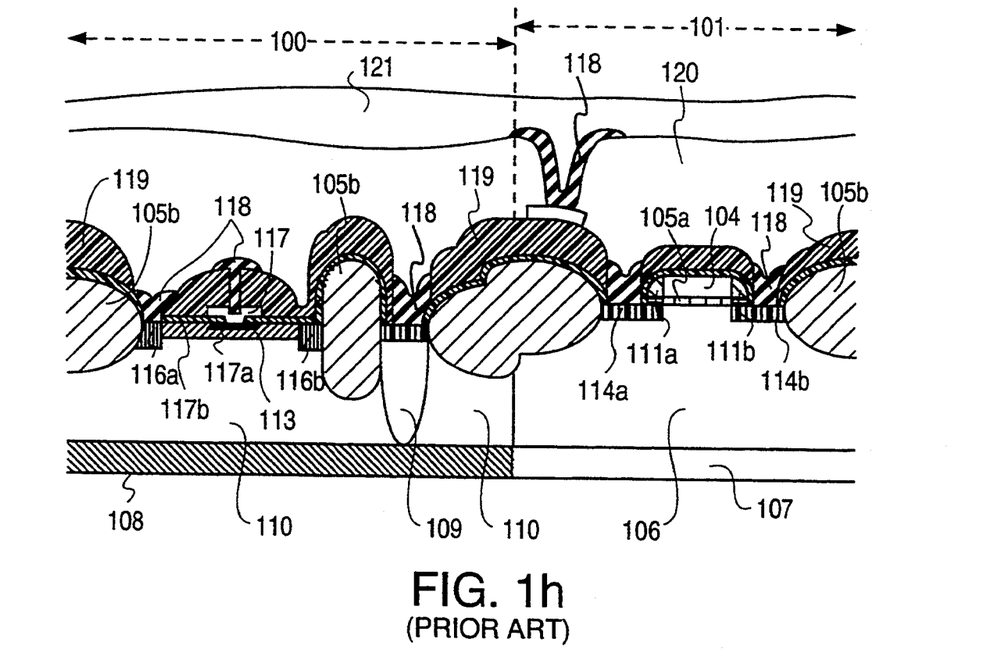

The photoresist layer which defines the exposed POLY II features is then removed. The implanted n-type dopant in the POLY II features is driven into the base region 113 through the emitter contact 117a by an oxidation cycle. The surface of the wafer is then provided with a layer of undoped oxide, followed by and a layer of Boro-Phospho-Silicate glass (BPSG) 119, which is patterned and selectively etched to allow the circuit elements to be interconnected by one or more layers of metallization 118 insulated by intermetal dielectric layer 120. The entire surface is then passivated by a passivation layer 121. The completed semiconductor structure is shown in FIG. 1h.

In the BiCMOS process just described, the finished bipolar transistors are prone to excessive emitter-base junction recombination currents. Such currents are observed in a special case study "Increased Current Gain and Suppression of Peripheral Base Currents in Silicided Self-Aligned Narrow-Width Polysilicon-Emitter Transistors of an Advanced BiCMOS Technology" IEEE Electron Device Letters, vol. EDL-9, No. 5, pp. 247–49, May 1988, by M. H. El-Diwany et al., in a different context.

To prevent damage to the bipolar active region, the oxide spacer etching step has been designed to leave a suitable thickness (e.g. 150 angstroms) of oxide on top of the active regions. However, this approach causes undesirable varying CMOS device performance because of (1) the inherent variations in thickness of the oxide layer 111 (which forms the oxide spacers 111a and 111b), and (ii) the selectivity of the etch and the non-uniformity caused by the oxide etcher. The major contribution is observed to stem from the configuration of the oxide etcher, which etches at different rates at the center of the wafer and at the edge of the wafer. Typically, across the wafer, variations of up to 350 Å can result.

SUMMARY OF THE INVENTION

In accordance with one embodiment of the present invention, a process for manufacturing semiconductor structures of BiCMOS circuits achieves low base recombination current in the bipolar transistor by forming from gate material a protective structure over a bipolar transistor active area. Source and drain regions are formed in the field effect transistor active area while the protective structure over the bipolar transistor active area remains intact, thereby shielding the base region from the harsh processing steps associated with the formation of the field effect transistors (e.g. the spacer etch step).

In accordance with a second embodiment of the present invention, a process for manufacturing semiconductor structures of BiCMOS circuits achieves low base recombination current by forming a protective structure, from material suitable for preventing formation of semiconductor oxide, selectively over the active areas of the bipolar transistors. Semiconductor oxides are then formed where the semiconductor structures are not protected by the protective structure. The protective structure is subsequently removed to expose the active area of the bipolar transistor prior to formation of the bipolar transistor's base region.

In addition to facilitating the fabrication of bipolar transistors having reduced base recombination current, the present invention also decouples the process-related performance parameters of the bipolar and CMOS transistors. A process in accordance with the present invention provides base active regions which are protected from particle contamination at the LTO deposition step, and prevents plasma damage at the ashing and resist-strip steps following the NMOS transistor source/drain implantation step.

A further advantage of the present invention is the avoidance of boron channeling during the base implant step.

The present invention will be better understood after consideration of the following detailed description in conjunction with the accompanying drawings.

DETAILED DESCRIPTION OF THE PREFERRED EMBODIMENTS

In this description, the areas in which the channels, sources and drains of MOS transistors, and the base-emitter and base-collector junctions of bipolar transistors are formed will be respectively referred to as the active areas of the field effect transistors, and the active areas of the bipolar transistors. Such active areas may be formed in a substrate of silicon or other suitable semiconductor, in epitaxial silicon, or in any other material suitable for the formation of semiconductor devices.

It has been observed that the anisotropical overetching of the low temperature oxide layer to form the oxide spacers on the sidewalls of the polycide gate of a MOS field effect transistor can actually etch into the active regions. This over-etching step is believed to create surface states underneath the low temperature oxide similar to those electronic states located in bare silicon. These surface states can significantly increase the forward-biased emitter-base junction recombination current, resulting in degradation of the current gain ("beta") in the finished bipolar transistor, and are detrimental to bipolar device reliability.

The present invention alleviates the enhanced recombination current problem due to surface states in the bipolar transistor.

The steps of a first embodiment of the present invention are illustrated in FIGS. 2a–j.

Figure 2A:
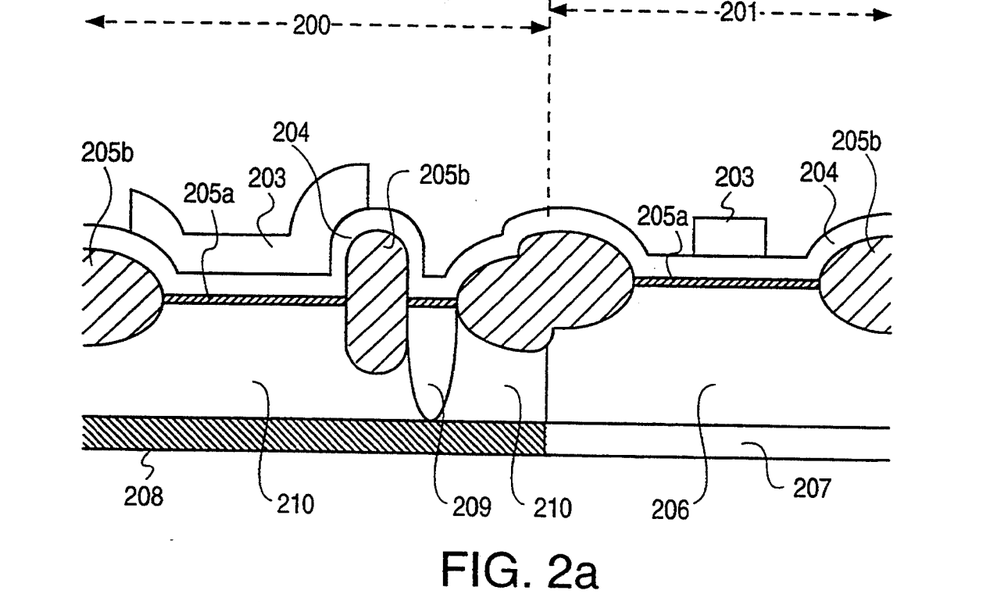
FIGS. 2a–j show various steps in an embodiment of the present invention.

FIG. 2a shows a BiCMOS semiconductor structure at an early stage of fabrication. The regions 200 and 201 are, respectively, regions of a semiconductor wafer in which a bipolar transistor and a NMOS transistor are to be formed. (Henceforth, region 200 is referred to as the bipolar region 200, and region 201 is referred to as NMOS region 201). The PMOS transistor is not shown in this Figure. Bipolar region 200 includes an n-type buried layer 208 underneath an N-well 210, which included a collector plug region 209. Likewise, NMOS region 201 includes a p-type buried layer 207 beneath a P-well 206.

On top of both P-well 206 and N-well 210 is formed in any suitable manner an oxide layer, which includes gate oxide 205a and field oxide 205b regions. The gate oxide and the field oxide layers are typically formed in separate fabrication steps. Gate oxide layer 205a and field oxide layer 205b are also often of different qualities.

A polycide layer 204, which is the material used to form the gates of the NMOS and PMOS transistor, is provided on top of the oxide layers 205a and 205b. This polycide layer 204 comprises tungsten silicide and phosphorus-doped polysilicon. This polycide layer 204 is formed by a first deposit of a polysilicon film about 3000 Å thick using any suitable deposition equipment, such as a LPCVD tube available from Thermco Corporation, California, at a deposition temperature of 615° C. The polysilicon film is doped to 24 ohms/square using any suitable equipment, such as a $POCl_3$ tube, also available from Thermco Corporation. Following deglaze and sulfuric acid clean steps, a film of tungsten silicide about 2000 Å thick is deposited using any suitable equipment, such as "Model #8402" CVD reactor available from Genus Corporation, Mountain View, Calif. The combination of the phosphorous doped polysilicon and tungsten silicide is collectively referred to as the polycide layer 204. Materials other than polycide, such as molybdenum, may also be used to form the gates of NMOS and PMOS transistors.

Figure 2B:
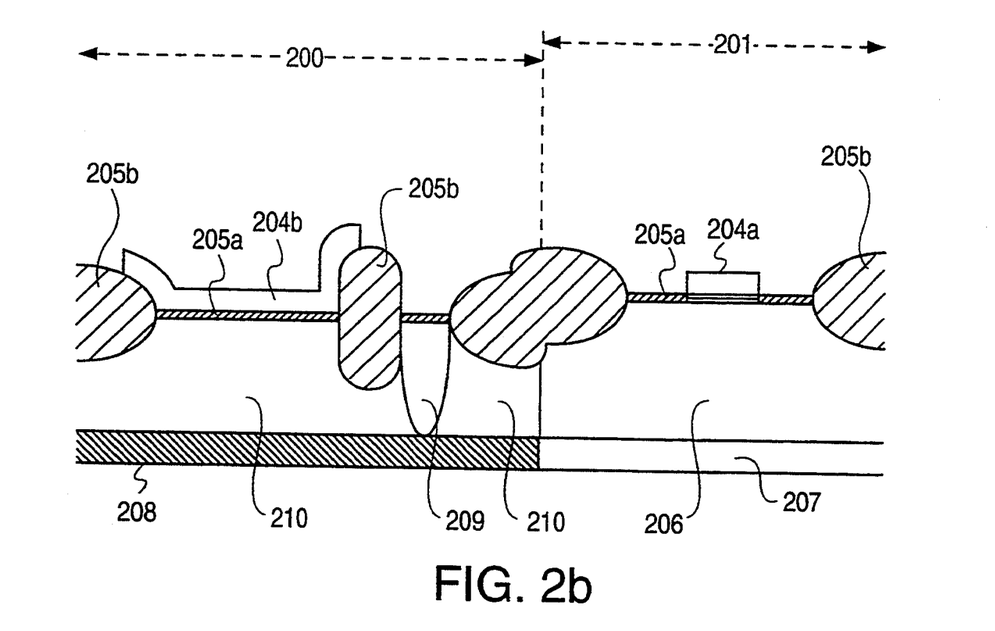
Figure 2C:
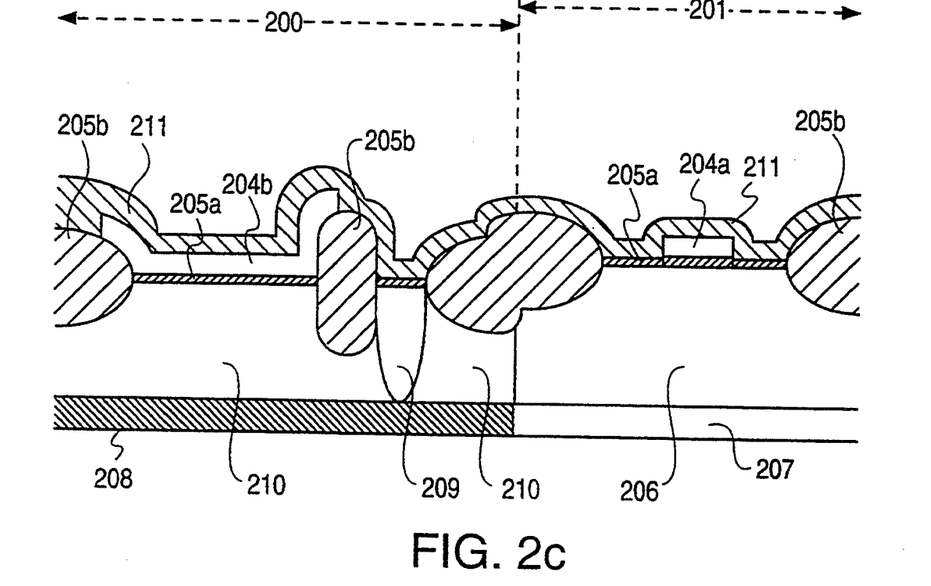

A polycide mask 203 is formed from a patterned photoresist layer 203. Polycide mask 203 not only masks the gate region of the NMOS transistor in NMOS region 201 and generally the gate regions of other field effect transistors, but also masks the active regions of the bipolar transistor in bipolar region 200, and generally the active regions of other bipolar transistors. Polycide layer 204 is selectively etched to leave the gate 204a of the NMOS transistor in NMOS region 201 and a protective structure 204b atop the active region of the bipolar transistor in bipolar region 200 (FIG. 2b). The gate of any PMOS transistor (not shown) is also formed at this step. After an annealing step for the remaining polycide structures (e.g. gate 204a and protective structure 204b), a low temperature oxide (LTO) layer 211 about 3000 Å thick is deposited in any suitable manner, such as using a CVD reactor obtainable from Anicon Inc., San Jose, Calif. (FIG. 2c). As can be readily seen in FIG. 2c, the protective structure 204b separates the LTO layer 211 from the active region of the bipolar region 200. Because gate oxide 205a covers the surface of the bipolar active region 200, this surface is naturally passivated by this layer of thermally grown gate oxide 205a, resulting in reduced density of electronic traps at the silicon surface. During the LTO deposition step, the active region of bipolar region 200 is protected by the protective structure 204b from particle contamination.

The material forming the protective structure 204b over the base region of the bipolar transistor may be any material suitable to form the gates of field effect transistors. The choice of material is primarily determined by the requirements of the field effect transistors. For example, pure tungsten is not suitable because of its susceptibility to channeling effects during the ion implant steps such as used to form the sources and drains of the field effect transistors. Channeling results in contamination by the implanted ionic species in the channel region of the transistor, thus affecting its operational characteristics.

As mentioned above, since the gate material is chosen for the protective structure 204b over the bipolar transistor active region 200, the surface of the bipolar region is naturally passivated by the layer of thermally grown gate oxide 205a. Such passivation markedly reduces the density of electronic traps at the silicon surface in the base region to result in a more stable bipolar transistor having electrical characteristics closer to an ideal bipolar transistor. E. H. Nicollian et al. discussed this effect in "MOS (Metal Oxide Semiconductor) Physics & Technology" John Wiley & Sons, New York, 1982, pp. 756–759.

Figure 2D:
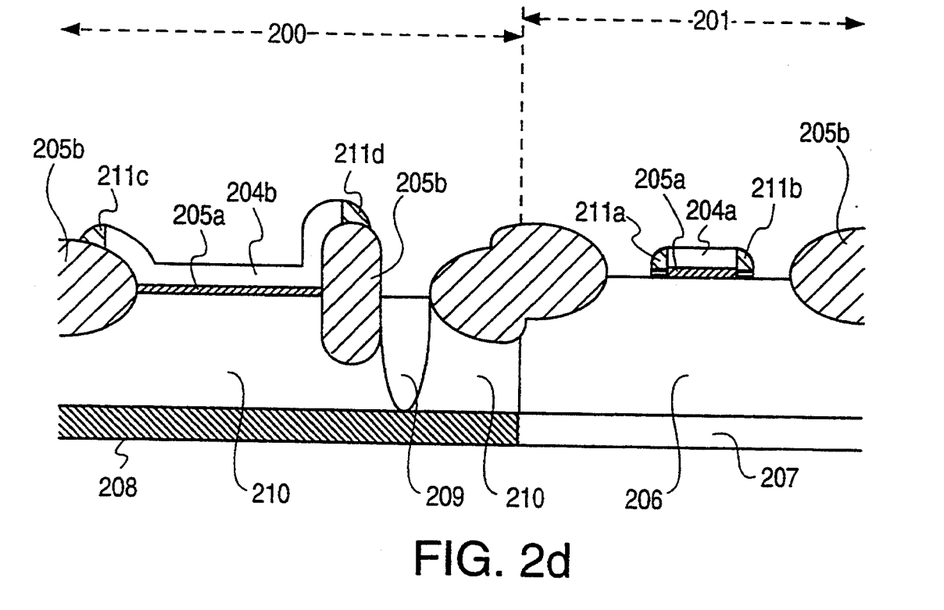

This LTO layer 211 is then anisotropically etched using, for example, an AMT8310 RIE plasma etcher available from Applied Materials, Inc. of Santa Clara, Calif., to form both oxide spacers 211a and 211b on the sidewalls of gate 204a, and oxide spacers 211c and 211d on the sidewalls of protective structure 204b FIG. 2d. Because of the inherent variation of oxide thickness across the wafer, the selectivity of the reactive ions used to perform the etching, and the configuration of the etcher, which tends to etch in different etch rates at the center and at the edge of the wafer, it is difficult to precisely control the thickness of oxide throughout the wafer. Variation of up to 350 Å is seen from a center location on the water to the edge of the wafer. However, because protective structure 204b provides a barrier between the LTO layer 211 and the underlying thermally grown gate oxide 205a, which passivates the silicon surface of the base region in bipolar region 200, the LTO layer 211 atop the active regions of the field effect transistors, such as in NMOS region 201, may be etched to substantial completeness, without any deleterious effect on gate oxide layer 205a and introducing defects in the bipolar region 200, thereby avoiding excessive base recombination current in the finished bipolar transistor. The present invention thus makes unnecessary the requirement of leaving a precisely controlled thickness of oxide on top of the active regions to avoid damage to the base region of the bipolar transistor. At the same time, the removal of substantially all oxide from the active region of the field effect transistors results in uniform and controllable electrical characteristics in the field effect transistors and resistors formed by the same source/drain implants.

Figure 2E:
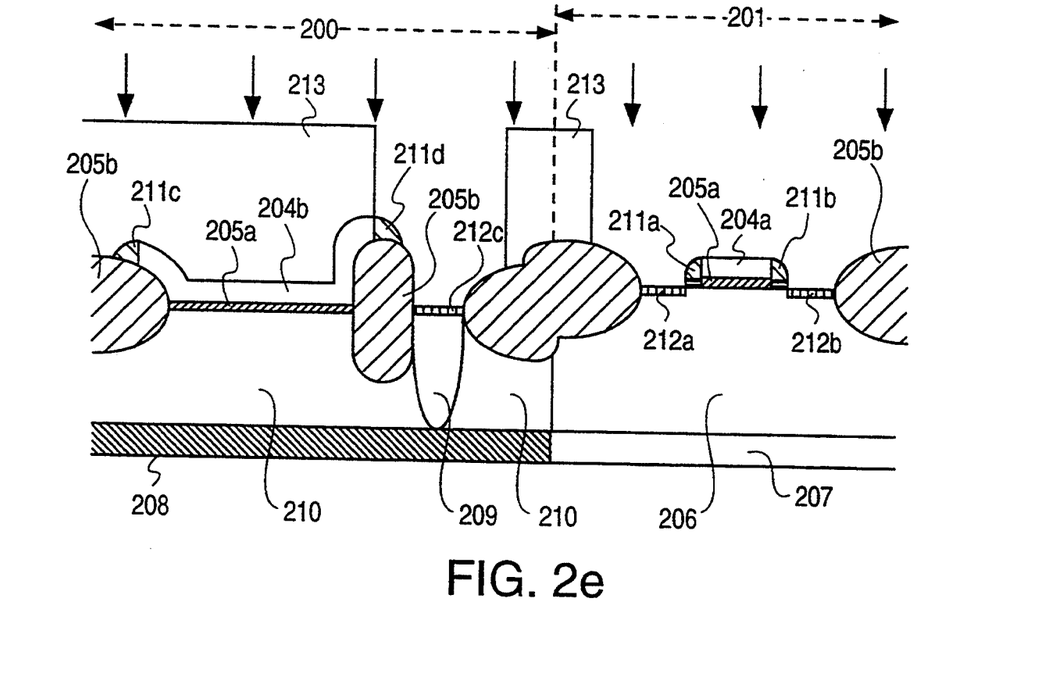

Photoresist layer 213 is deposited and patterned to form openings for n-type ion implant in the collector contact 212c inside the collect plug region 209 of the bipolar region 200, and source and drain regions 212a and 212b of NMOS region 201 (FIG. 2e). The n-type ionic species used for this implant can be phosphorous, arsenic, or both. If both arsenic and phosphorous are used, suitable implant doses are $8.0 \times 10^{15}$ at 65 KeV and $1.5 \times 10^{14}$ at 65 KeV respectively.

The photoresist layer 213 is removed by an ashing step using oxygen plasma, followed by a resist-strip step, using a reagent commonly known as "piranha" solution. During the ashing and resist-strip steps, protective structure 204b shields the passivated active area of bipolar region 200.

Figure 2F:
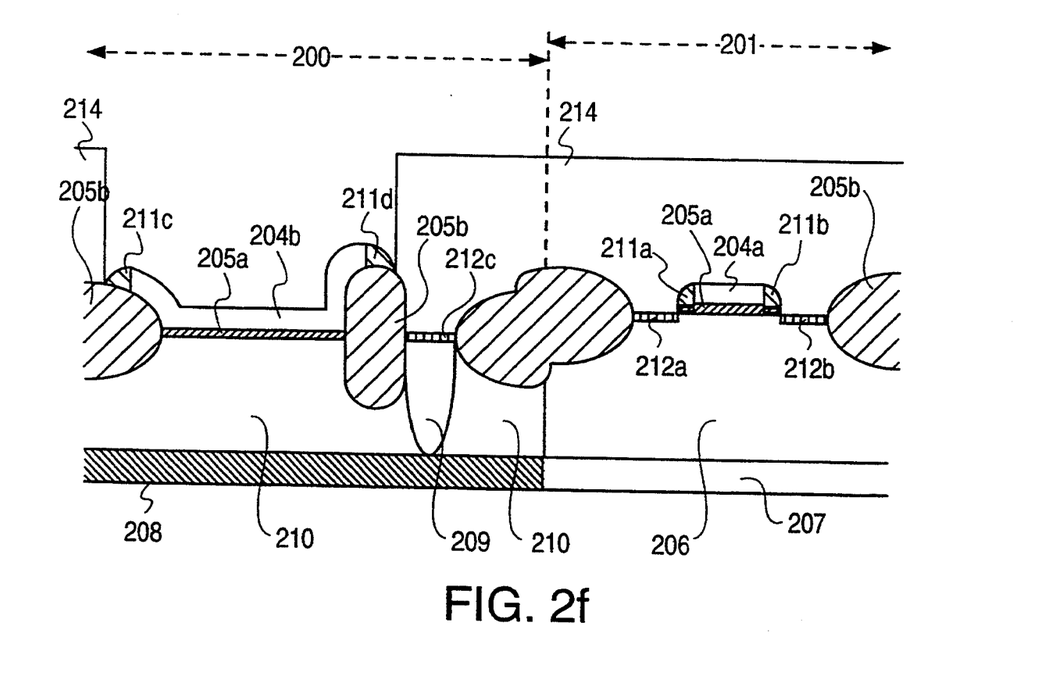
Figure 2G:
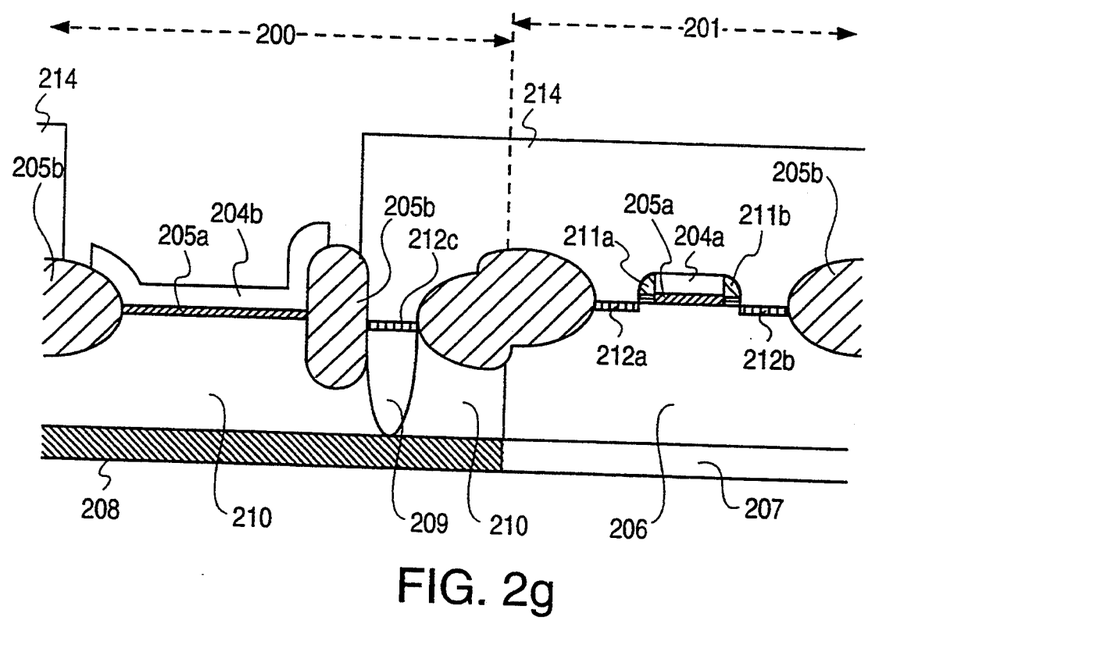

Photoresist layer 214 is then deposited and patterned to form openings for ion implant in the active area of bipolar region 200 (FIG. 2f). A wet etch step, called a buffered oxide etch, using a 7:1 (by volume) solution of HF and ammonium fluoride at 30° C., removes the oxide spacer structures 211c and 211d from the sidewalls of the protective structure 204b (FIG. 2g). After the buffered oxide etch, a polycide etch, using any suitable plasma etcher, such as "LAM Model 490" available from LAM Research Corporation, Fremont, Calif., removes the protective structure 204b to expose the gate oxide 205a atop the active area of bipolar region 200. The wet etching step to remove the oxide spacers 211c and 211d improves planarity, but oxide spacers 211c and 211d may be left in place if desired. Improved planarity prevents breakage in metal interconnect, which may happen if the BPSG layer in a subsequent step is too thinly deposited. The polycide etch step is allowed up to 15% overetch to ensure complete removal of the polycide protective structure 204b.

Figure 2H:
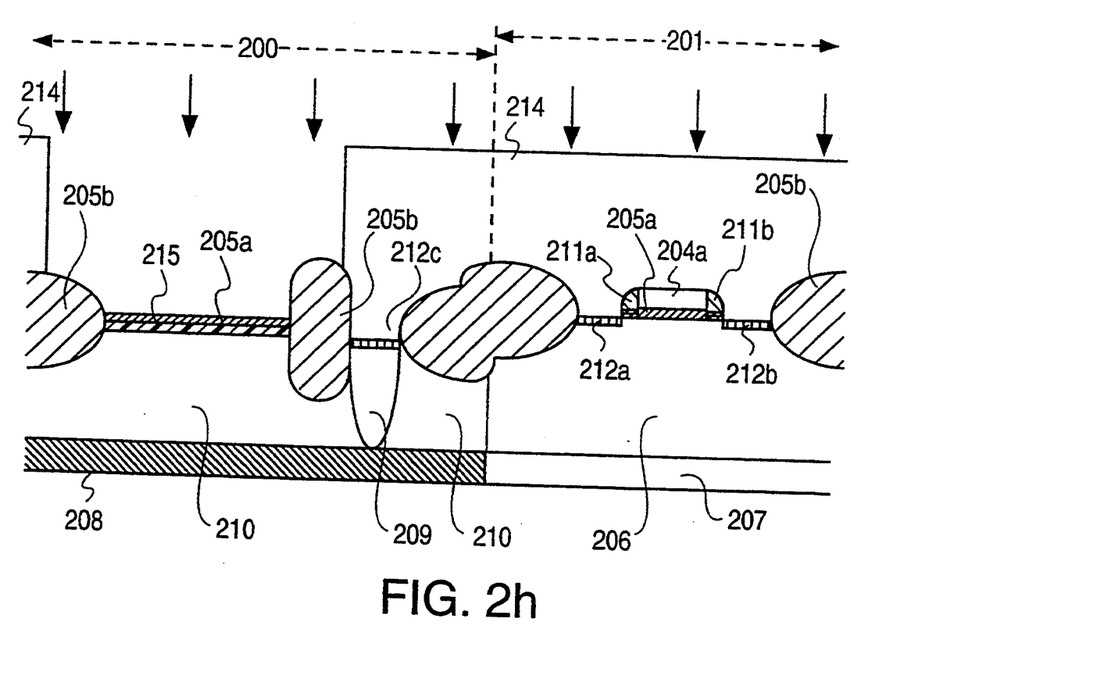
Figure 2I:
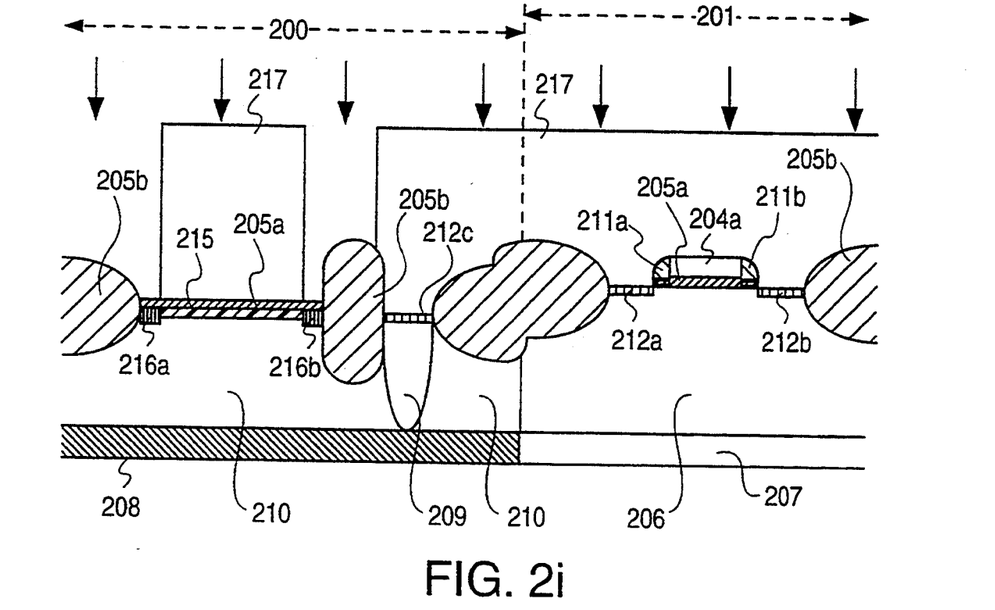

P-type ions are then implanted into the gate oxide 205a atop the active region of bipolar region 200. The implanted ions, such as boron, penetrate the silicon under gate oxide 205a to form the base 215 of the bipolar transistor in bipolar region 200 (FIG. 2h). Because the boron ions are implanted through an oxide layer 205a, which is preserved by the protective structure 204b, the channeling tail effect associated with a boron-bare silicon implant is avoided, since channeling does not occur in an oxide layer. As a result, very narrow base width necessary for high bipolar transistor performance is achieved. Furthermore, the gate oxide layer 205a serves to passivate the surface of the base active area by eliminating the formation of trap sites and dangling bonds on the silicon surface. This passivation effect enhances reliability in the bipolar transistor.

After photoresist layer 214 is removed by ashing and resist-strip steps, using suitable reagents such as oxygen plasma and sulfuric acid respectively, photoresist layer 217 is provided and patterned to make openings for ion implant in the base contact areas 216a and 216b (FIG. 2i) of the bipolar transistor, and the source and drain regions of PMOS transistors (not shown). One suitable ionic species for forming source and drain regions of PMOS transistors is boron difluoride ($BF_2$), using an implant dose of $3.0 \times 10^{15}$ at 45 KeV.

After stripping off photoresist layer 217, a 2000 Å thick low temperature oxide (LTO) layer 224 is deposited by any suitable method for low temperature oxide deposition, such as a CVD reactor from Anicon Inc., San Jose, Calif. This low temperature oxide layer 224 is then patterned and then selectively etched to form contact regions for a second layer of polysilicon ("Poly II"). Such contact regions include emitter contact region 217a.

Figure 2J:
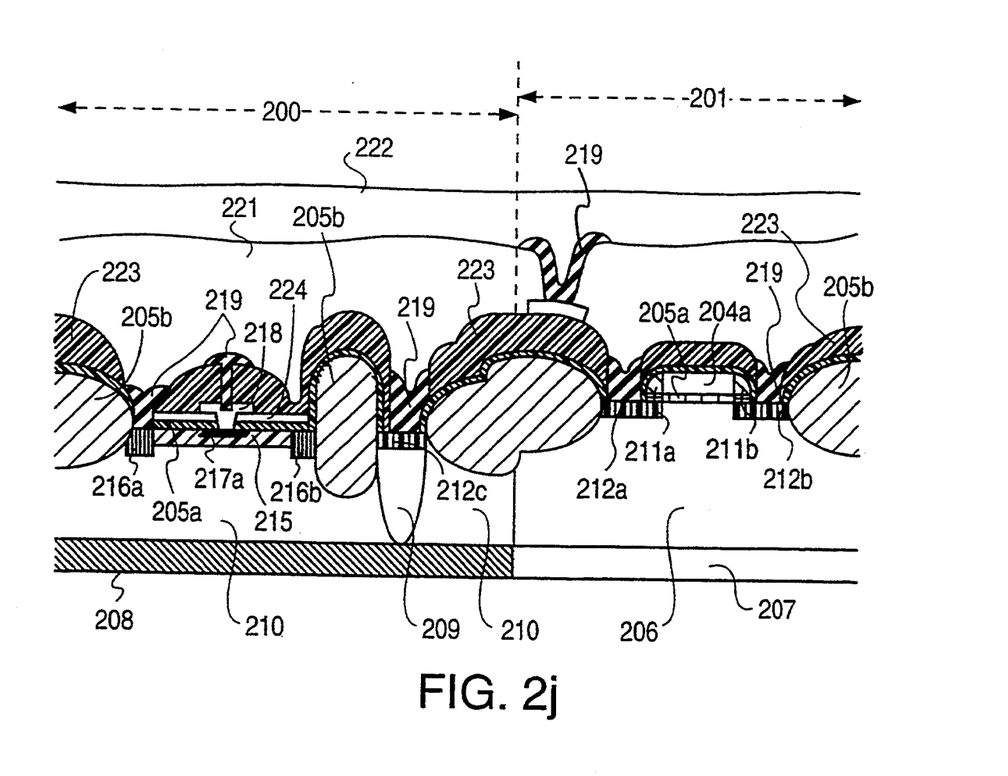

A patterned second layer 218 of polycide or polysilicon provides the emitter of the bipolar transistor (FIG. 2j). The emitter is formed as the n-type dopant, such as arsenic, in the polysilicon diffuses into the silicon surface underneath. The surface of the wafer is then provided with a layer 220 of Boro-Phospho-Silicate glass (BPSG) which is patterned and selectively etched to allow the circuit elements to be interconnected by one or more layers of metallization 219 insulated by intermetal dielectric layer 221. This dielectric layer 221 comprises a low temperature oxide (LTO) of about 15500 Å thick, deposited by a suitable apparatus, such as the "ACVD" reactor obtainable from Anicon Inc. discussed earlier.

Planarization of this dielectric surface is achieved by etching back the LTO layer 221 until 17500 Å of oxide remains in the field regions. The etch back step is followed by deposition of a film of undoped plasma oxide, about 8000 Å thick, using a suitable apparatus, such as the Concept One (Trademark) reactor, obtainable from Novellus Systems, Inc. of San Jose, Calif. Both via and a second layer of metal can be suitably patterned to provide extra interconnections, as is well known in the art.

The entire surface is then passivated by a passivation layer 222. Passivation layer 222 may be any suitable passivation layer, such as a deposited film of polysilicon glass of about 6000 Å thick, followed by a similarly thick nitride. Both films can be deposited by the Novellus reactor discussed earlier in conjunction with the deposition of plasma oxide in dielectric layer 221. The completed semiconductor structure is shown in FIG. 2j.

Figure 3A:
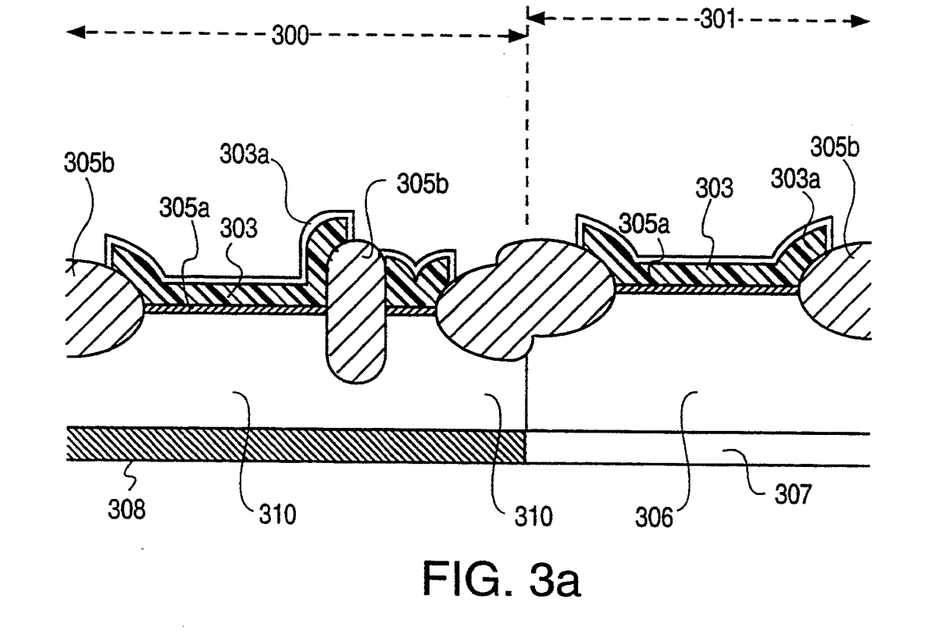
FIGS. 3a–e show various steps in a second embodiment of the present invention.

So far, I have described an approach of obtaining a highly manufacturable bipolar transistor with minimum base recombination current in a BiCMOS technology without incurring any extra photo-masking steps. However, it is also possible to use an alternate thin film as protective structure other than the gate material described above for protective structure 204b. FIGS. 3a–3e illustrate a second embodiment of the present invention. FIG. 3a shows a cross-section of a semiconductor structure having regions 300 and 301, respectively designated for the formation of a bipolar transistor and a NMOS transistor. As shown in FIG. 3a, in region 300, an n-type buried layer 308 formed by a suitable method is underneath an N-well 310, also formed by any suitable method. In region 301, a p-type buried layer 307, formed by any suitable method, is underneath P-well 306, also formed by any suitable method.

A thermally grown pad oxide 305a 380 Å thick is provided on the surface of the regions 300 and 301. A layer 303 of nitride is deposited using an LPCVD technique at 800° C. for one hour in a 3:1 gaseous mixture of dichloro-silane and ammonia, to a thickness of about 1700 Å, and selectively patterned.

The nitride layer 303 serves two purposes in this embodiment. Firstly, it serves as an oxidation mask for the field oxide to be grown next. Secondly, the nitride layer 303 in the bipolar region 300 will form a protective structure over the bipolar active region 300, similar to the purpose served by protective structure 204b of FIGS. 2a–g.

A standard local oxidation of silicon (LOCOS) at 950° C. and steam ambient for six hours yields the 6000 Å field oxide 305b. Even though the nitride layer 303 shields much of the silicon surface from oxidation, a thin layer of oxide, shown in FIG. 3a as layer 303a, is nevertheless formed. FIG. 3a represents a semiconductor structure after the completion of the LOCOS step.

Figure 3B:
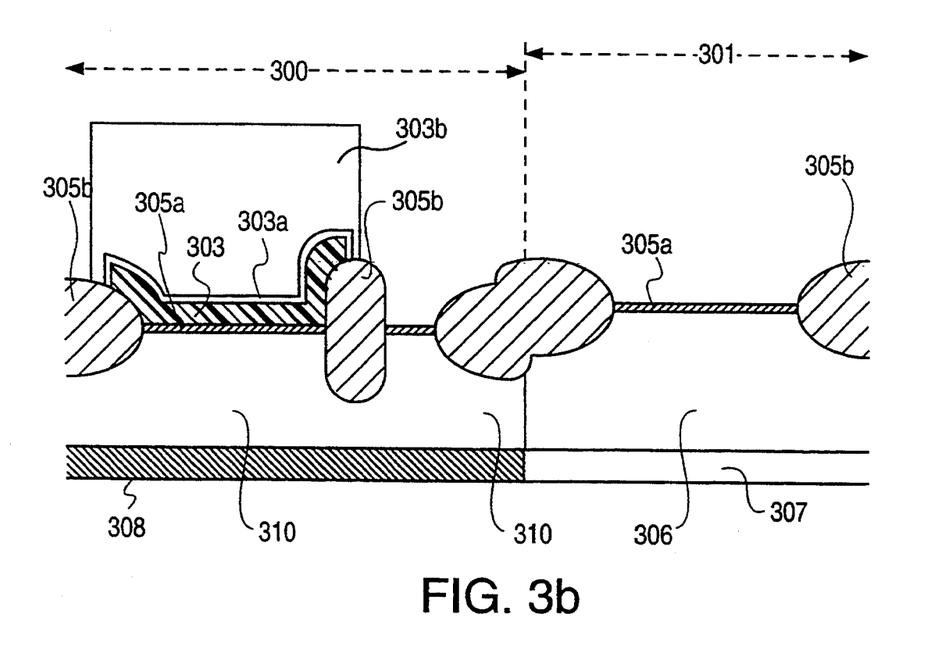

A photoresist layer 303b is applied and suitably patterned so that it will protect the thin oxide layer 303a, silicon nitride layer 303 and the pad oxide 305a atop the base region in bipolar region 300 during the next steps of wet oxide etch and wet nitride etch (FIG. 3b).

The photoresist layer 303b is patterned to protect only the bipolar region 300, and expose the NMOS transistor 301 and PMOS transistor (not shown), so that the portion of nitride layer 303 in region 300 will be allowed to remain until after a subsequent overetch during the formation of oxide spacers discussed above.

The wet oxide etch is intended to remove the thin oxide layer 303a on top of the nitride layer 303. This wet oxide etch is a 7:1 buffered oxide etch (HF and ammonium fluoride) at 30° C. for approximately 25 seconds, which should allow the nitride layer 303 in the field effect transistor regions, such as NMOS regions 301, to be exposed. The wet nitride etch is performed in hot phosphoric acid at 170° C. for 75 minutes. The wet etch is completed by a cleaning step using another buffered oxide etch of 10 seconds to remove any impurity or irregularity on the semiconductor surface.

FIG. 3b shows the resulting semiconductor structure after the wet oxide and wet nitride etch steps.

After this wet oxide and wet nitride etch steps, the photoresist layer 303b is stripped off. A sacrificial oxidation step is provided to grow an oxide about 260 Å thick on top of the silicon surface exposed by the nitride etch. This oxide is then removed by a 7:1 (by volume) Buffered Oxide Etch (HF and Ammonium Fluoride). This sacrificial oxidation and removal are provided to ensure that the removal of the nitride from the field effect transistor regions, such as NMOS regions 301, is complete. The sacrificial oxidation and removal avoids "Kooi effect" or "white ribbon" phenomenon.

Figure 3C:
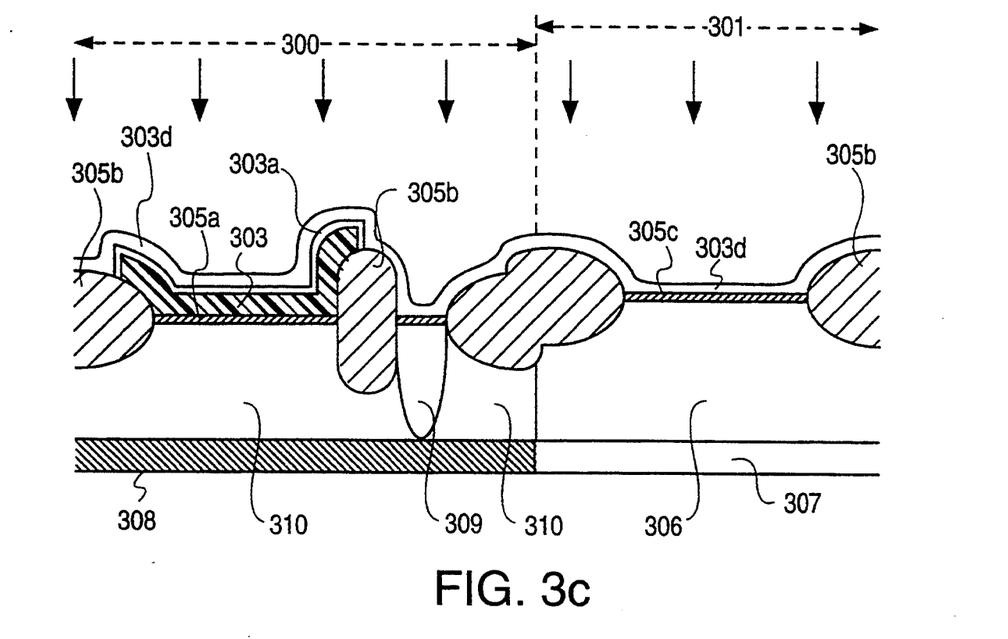

After the sacrificial oxidation step is completed, the semiconductor surface is suitably patterned for a deep N+ implant of the collector plug region, which is shown as region 309 in FIG. 3c. The deep N+ implant uses phosphorus as ionic species at a dose of $5.0 \times 10^{15}$ at 100 KeV.

After the collector implant mask removal step, a gate oxide 305c (FIG. 3c) is grown to a thickness of 245 Å in dry oxygen Ambient at 950° C. for approximately 50 minutes. (The sacrificial oxide, the collector plug implant, and the gate oxide steps are discussed in P. Tong et al., "A Production Proven High Performance 1.0 $\mu$m Double-Level Polysilicon BiCMOS Technology" Semiconductor Technical Journal published by Samsung Semiconductor, vol. 5, No. 1, pp. 106–112, June 1990).

A polycide layer 304 is formed by depositing at first an intermediate layer of 500 Å thick polysilicon 303d using any suitable deposition equipment, such as a LPCVD tube available from Thermco Corporation, California, at a deposition temperature of 615° C. A VT (threshold voltage) implant of boron ions at a dose of $8.5 \times 10''$ at 45 KeV is implanted through this layer of intermediate polysilicon. This VT implant adjusts the threshold voltages of both the NMOS and PMOS field effect transistors. (FIG. 3C)

In the first embodiment discussed above, the VT implant is performed prior to the deposition of the polycide layer 204 in FIG. 2a, so that the VT implant will go into not only the NMOS, PMOS active regions, but also the Bipolar base active region as well. By contrast, the nitride structure 303 of the second embodiment protects the base active region from the ionic species during the VT implant.

A deposition of another 2500 Å polysilicon film using any suitable deposition equipment, such as a LPCVD tube available from Thermco Corporation, California, at a deposition temperature of 615° C. is then performed. This polysilicon film is doped to 24 ohms/square using any suitable equipment, such as a POCl$_3$ tube, also available from Thermco Corporation. Following deglaze and sulfuric acid clean steps, a film of tungsten silicide about 2000 Å thick is deposited using any suitable equipment, such as "Model #8402" CVD reactor available from Genus Corporation, Mountain View, Calif. The combination of the phosphorus doped polysilicon and tungsten silicide is collectively referred to as the polycide layer 304.

Figure 3D:
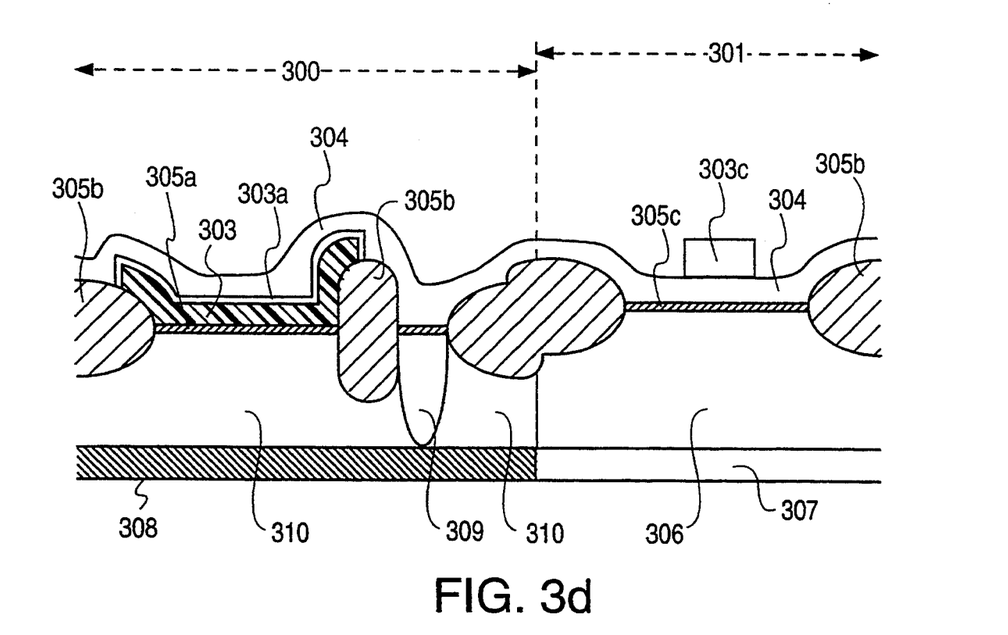

Photoresist 303c is then applied and developed to define the gate areas of the field effect transistors. FIG. 3d is a cross section of the semiconductor structure after photoresist 303c is applied and developed.

The next step is a polycide etch, which is already described in conjunction with the first embodiment of the present invention shown in FIGS. 2a–j. Oxide spacers 311a and 311b are formed after deposition of an LTO and a subsequent spacer etch. The formation steps of the spacers 311a and 311b are identical to those described with respect to oxide spacers 211a and 211b of the embodiment of the present invention shown in FIGS. 2a–j. Because of the nitride protective structure 303, the surface of the base active region in bipolar region 300 is protected from damage from the overetch. Therefore, the benefit of the protective structure 204b, described above in conjunction with the first embodiment, is also realized by the protective structure 303 of this second embodiment.

The next steps in this second embodiment, which involves the formation of the collector contact 312c, the source 312a and drain 312b regions of NMOS region 301, are identical to the steps to form corresponding structures in the first embodiment.

Figure 3E:
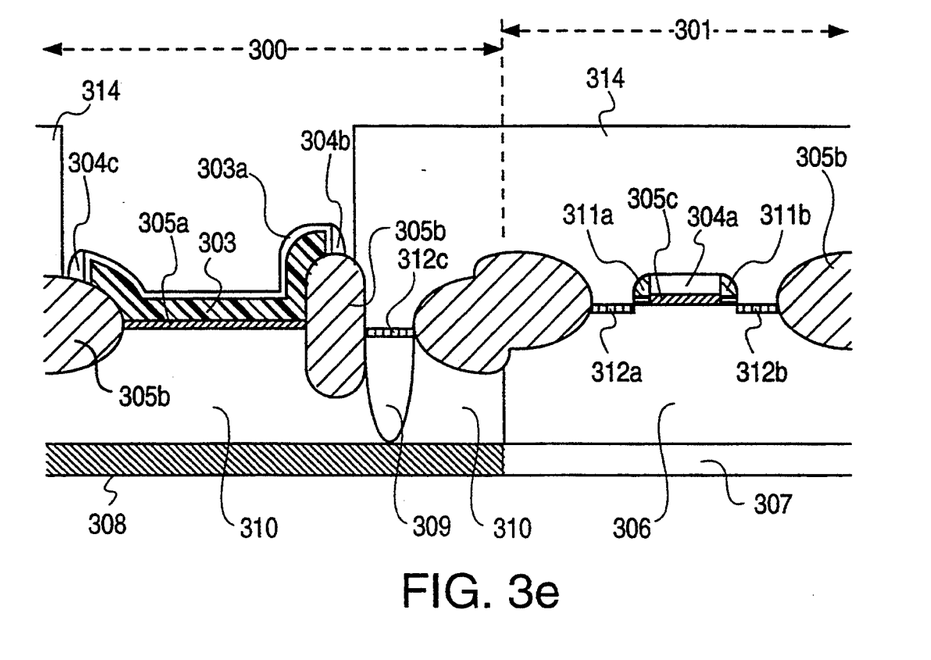

The structure carved out of the polycide layer 304 by the etching step forms the gate 304a and the polycide spacers 304b and 304c on the sidewalls of protective structure 303 (FIG. 3e).

Photoresist layer 314 is then deposited and patterned to form openings for ion implant in the active area of bipolar region 300 (FIG. 3e). A polycide etch, using any suitable plasma etcher, such as the "Model 490" available from LAM Research Corporation, Fremont, Calif., removes the polycide spacers 304b and 304c from the sidewalls of the protective structure 303, after which a short wet oxide dip followed by a plasma nitride etch, using any suitable plasma etcher, such as "LAM 490-2" available from LAM Research Corporation, Fremont, Calif., removes the protective structure 303.

A p-type ion implant is made into the pad oxide 305a atop the active region of bipolar region 300. The implanted boron penetrates into the silicon under pad oxide 305a to form the base of the bipolar transistor in bipolar region 300 (not shown). From this point on, all subsequent process steps are identical to those subsequent to the base implant described in the first embodiment.

While my invention has been described with respect to the embodiments set forth above, other embodiments and variations not described herein are within the scope of my invention. For example, my invention is not to be considered limited to the specific BiCMOS process sequence described, or limited to the ranges or specific values of process parameters and materials specified, as the choice of parameter values and materials depends on the characteristics desired of the integrated circuit devices in a manner well known in the art. Moreover, my invention is generally applicable to processes involving the formation of field effect transistors and bipolar transistors, such as bipolar-NMOS processes. Accordingly, other embodiments, variations and improvements not described herein are to be considered within the scope of my invention as defined by the following claims.

I claim:

1. A process for manufacturing field effect and bipolar transistor structures in respective active areas, said bipolar transistor active area comprising a base-emitter junction area and a base-collector junction area, comprising the steps of:

forming a layer of gate material over said field effect transistor active area and said bipolar transistor active area;

forming from said layer of gate material a gate over a first region of said field effect transistor active area, and a protective structure over said base-emitter junction area of said bipolar transistor active area;

implanting source and drain regions in said field effect transistor active area, proximate to said first region, said protective structure being intact over said base-emitter junction area of said bipolar transistor active area during said source drain implanting step;

removing said gate material from said base-emitter junction area of said bipolar transistor active area; and forming an emitter region in said bipolar transistor active area.

2. A process as in claim 1, wherein said gate comprises a conductive layer overlaying a gate oxide film.

3. A process as in claim 2, wherein said conductive layer comprises polysilicide film.

4. A process as in claim 2, wherein said conductive layer comprises doped polysilicon film.

5. A process as in claim 1, wherein after said implanting step, said process further comprises the steps of:

removing said protective structure; and forming base-collector and emitter-base junctions in said bipolar transistor active area.

6. A process as in claim 1, wherein said step of forming said gate and said protective structure is a single masking step.

7. A semiconductor device fabrication process for protecting a bipolar transistor active area, said bipolar transistor active area comprising a base-emitter junction area and a base-collector junction area, while forming source and drain regions in a field effect transistor active area, said bipolar transistor and field effect transistor active areas being in an intermediary having a layer of gate material over a layer of gate dielectric, comprising the steps of:

forming from said gate material a gate over a channel region in the active area of said field effect transistor, and a protective structure over said base-emitter junction area of said bipolar transistor;

forming source and drain regions in the active area of said field effect transistor, said protective structure being intact over said base-emitter junction area of said bipolar transistor;

removing said gate material from said base-emitter junction area of said bipolar transistor active area; and forming an emitter region in said bipolar transistor active area.

8. A process as in claim 7 wherein said step of forming a gate and protective structure is a single masking step.

9. A process as in claim 7, wherein said conductive layer comprises polysilicide film.

10. A process as in claim 7 wherein said conductive layer comprises a doped polysilicon film.

11. A process as in claim 7 wherein said step of forming source and drain regions comprises the step of performing a selective implant of ionic species.

12. A process as in claim 1 further comprising after said step of forming the gate and the protective structure, a step of forming oxide spacers on sidewalls of said gate.

13. A process as in claim 12, wherein said step of forming the oxide spacers comprises a step of depositing a layer of low temperature oxide and a step of anisotropically etching the low temperature oxide layer to leave said oxide spacers.

14. A process as in claim 13 wherein said step of etching the low temperature oxide layer exposes said source and drain region in said field effect transistor active area.

15. A process as in claim 5 wherein a gate oxide layer is underlaid by said layer of gate material.

16. A process as in claim 15 wherein said step of forming a base-collector junction comprises a step of implanting an ion into said bipolar transistor active area through said gate oxide layer.

* * * * *